United States Patent
Kasahara et al.

(10) Patent No.: US 7,624,298 B2
(45) Date of Patent: Nov. 24, 2009

(54) MEMORY CARD, DATA PROCESSOR, MEMORY CARD CONTROL METHOD AND MEMORY CARD SETTING

(75) Inventors: Tetsushi Kasahara, Osaka (JP); Tomoaki Izumi, Osaka (JP); Masahiro Nakanishi, Kyoto (JP); Kazuaki Tamura, Osaka (JP); Kiminori Matsuno, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/597,650

(22) PCT Filed: Feb. 2, 2005

(86) PCT No.: PCT/JP2005/001496

§ 371 (c)(1),
(2), (4) Date: Mar. 13, 2007

(87) PCT Pub. No.: WO2005/076203

PCT Pub. Date: Aug. 18, 2005

(65) Prior Publication Data

US 2007/0186040 A1 Aug. 9, 2007

(30) Foreign Application Priority Data

Feb. 3, 2004 (JP) ............................. 2004-026413

(51) Int. Cl.
*G06F 11/00* (2006.01)
(52) U.S. Cl. ........................................... 714/5; 714/42
(58) Field of Classification Search ..................... 714/5, 714/42

See application file for complete search history.

(56) References Cited

U.S. PATENT DOCUMENTS 4,706,190 A * 11/1987 Bomba et al. ................ 710/108
5,369,532 A * 11/1994 Dodt et al. ..................... 360/48

(Continued)

FOREIGN PATENT DOCUMENTS

EP 0619541 7/2003

(Continued)

OTHER PUBLICATIONS

English Language Abstract of JP 8-235028.

(Continued)

*Primary Examiner*—Bryce P Bonzo
(74) *Attorney, Agent, or Firm*—Greenblum & Bernstein, P.L.C.

(57) ABSTRACT

A memory card (1) includes a host interface (2) that transmits and receives a command and data to and from the data processor (50), a nonvolatile memory (7) that stores data, a controller (3) that controls the operation of the memory card, and a storage section (32) that stores specified management information. The management information includes retry setting information which specifies whether a retry function is executed or not when an error occurs during an operation of writing data to the nonvolatile memory. The controller (3) refers to the retry setting information in the data writing operation, and controls the data writing operation so as to disable the retry function in the event of an error in the data writing operation, when the retry setting information indicates disabling of the retry function or to enable the retry function in the event of an error in the data writing operation, when the retry setting information indicates enabling of the retry function.

7 Claims, 5 Drawing Sheets

U.S. PATENT DOCUMENTS

| | | | | |
|---|---|---|---|---|
| 5,530,673 | A | 6/1996 | Tobita et al. | |
| 5,828,583 | A * | 10/1998 | Bush et al. | 702/185 |
| 5,862,083 | A | 1/1999 | Tobita et al. | |
| 5,973,964 | A | 10/1999 | Tobita et al. | |
| 6,078,520 | A | 6/2000 | Tobita et al. | |
| 6,275,436 | B1 | 8/2001 | Tobita et al. | |
| 6,993,690 | B1 | 1/2006 | Okamoto | |
| 7,120,737 | B1 * | 10/2006 | Thelin | 711/112 |
| 7,177,989 | B1 * | 2/2007 | McGinnis | 711/151 |
| 7,360,713 | B2 * | 4/2008 | Nishizawa et al. | 235/492 |
| 2002/0039312 | A1 | 4/2002 | Nomura et al. | |
| 2002/0051394 | A1 | 5/2002 | Tobita et al. | |
| 2006/0195708 | A1 | 8/2006 | Kato et al. | |

FOREIGN PATENT DOCUMENTS

| | | |
|---|---|---|
| JP | 7-014392 | 1/1995 |
| JP | 7-028690 | 1/1995 |
| JP | 8-235028 | 9/1996 |
| JP | 2000-181805 | 6/2000 |
| JP | 2002-108720 | 4/2002 |

OTHER PUBLICATIONS

English Language Abstract of JP 7-014392.
English Language Abstract of JP 7-028690.
English Language Abstract of JP 2000-181805.
English Language Abstract of JP 2002-108720.
U.S. Appl. No. 10/577,418 to Meada et al., filed on Apr. 27, 2006.

* cited by examiner

Fig.2

32 REGISTER

| |
|---|
| RETRY ENABLE BIT |
| ERROR CORRECTION ENABLE BIT |
| MAXIMUM REQUIRED TIME OF DATA WRITING (WITH RETRY PROCESS, WITHOUT RETRY PROCESS) |
| RETRY OCCURRENCE FREQUENCY |
| ERROR OCCURRENCE FREQUENCY |
| ERROR RATE (WITH ERROR CORRECTION, WITHOUT ERROR CORRECTION) |
| ⋮ |

| BLOCK ADDRESS | | USAGE STATE (1:UNUSED, 0:USED) |
|---|---|---|
| PHYSICAL ADDRESS | LOGICAL ADDRESS | |
| 0 | — | 1 |
| 1 | 3 | 0 |
| 2 | 4 | 0 |
| 3 | 5 | 0 |
| 4 | — | 1 |
| 5 | 1 | 0 |
| 6 | — | 0 |
| 7 | — | 1 |
| 8 | 6 | 0 |
| 9 | — | 1 |
| 10 | — | 1 |
| 11 | — | 1 |
| ⋮ | ⋮ | ⋮ |

MEMORY CARD, DATA PROCESSOR, MEMORY CARD CONTROL METHOD AND MEMORY CARD SETTING

TECHNICAL FIELD

The invention relates to a memory card which has a programmable nonvolatile memory, is installed in a host to be used, and more particularly to a memory card having a retry function in data writing and error correction function in data reading, and a data processor (host) for accessing such a memory card.

BACKGROUND ART

Recently, memory cards and devices mounting programmable nonvolatile memories are spreading widely as storage devices for storing digital information. In particular, memory cards are small and resistant to vibration, and are expected to be used more and more in portable appliances.

Typical programmable nonvolatile memory is a NAND type flash memory (called "flash memory" hereinafter). In the flash memory, usage state (used/unused) is managed by block unit. For example, "1" is written in management data for an unused block, and after data writing the management data is rewritten from "1" to "0".

Very rarely, in a flash memory, data may not be written correctly. Accordingly, the flash memory has a function of reading status showing whether writing is normal or abnormal, and has to judge if writing is normal or not by reading the status after writing data. A certain memory card includes a controller for controlling the flash memory. The controller reads the status after writing of data, and rewrites the management data which is incorporated in the controller and corresponds to the error block from "1" to "0" when write error occurs.

It is also proposed that when data is not written normally, that is, when write error occurs, the data is written in other block again (hereinafter called "retry process"). Write error occurs, for example, when the flash memory has no vacant capacity, when write operation is impossible because of bad region of the flash memory, or when erase process fails on write operation.

In the data written in the flash memory, data may be deformed rarely by data writing into other block or due to aging effects. Hence, in order to assure desired data reliability as a memory card, when reading out data, for example, error correction code according to reliability of the flash memory is generated in block unit, is added to the block data, and written into the flash memory. When reading out data, the read data is processed by error processing, and is transferred to the host.

Thus, write error and read error rarely occurring in the flash memory can be avoided mostly by the retry process or the error correction process by the controller incorporated in the memory card. Accordingly, the host device can use the memory card without fear of data reliability of flash memory.

Patent document 1 discloses technology relating to such a retry process for write error in the flash memory.

Patent document 1: JP-A-2002-108720

DISCLOSURE OF THE INVENTION

Memory cards are recently used not only in consumer electronic appliances, but also in host devices in various applications. The conventional memory card reliability may not be sufficient to some host devices.

In a flash memory likely to cause write error, by retry process in the event of Write error, frequency of write error notified to the host is lowered. As a result, the host is free from special consideration about process to be conducted when notified of write error, resulting in the reduced host processing load. However, since the retry process is done inside the flash memory, the host side has no knowledge about write error occurring in the flash memory or retry process. When the writing time is much extended by the retry process and write error also occurs in the retry process, after waiting for notice of completion of writing during the retry process, it may finally result in write error.

Since the digital still camera for recording a still image is not required for real time process, the host (digital still camera) can conduct processing even after notified of the write error. However, the video camera for recording a moving picture is required for the real time process. When the retry process is executed in a memory card, the writing time may be extended, and it is hard to estimate the writing time on the video camera (host) side, and data processing in the video-camera (host) may be very complicated. Therefore, the retry process in the memory card may not be always effective function in the host which demands the real time processing.

In a conventional memory card, an error correction code is added according to the reliability of the flash memory so as to achieve a desired data reliability for a memory card. For example, a memory card incorporating a flash memory with high reliability has a 1-bit correction circuit, and a memory card incorporating a flash memory with low reliability has a 3-bit correction circuit. Both memory cards have equal reliability. The memory card having a 3-bit correction circuit can correct an error of up to 3 bits. However when an error of 4 bits or more occurs, it cannot correct the error and notifies the host of the error. In this case, wrong correction may be made and wrong data may be returned to the host. Usually, probability of falling in such case is set very low. However, as far as error may be notified and wrong data may be read as a normal data, the reliability cannot be enhanced more than the error correcting ability of the memory card on the host side, in a host of professional use or a host demanding a very high reliability.

(Solving Means)

The invention is devised to solve these problems, and it is hence an object thereof to provide a memory card capable of solving the problems caused by the retry process in the memory card or error correction process of the memory card, and a control method of the memory card.

(1) In a first aspect of the invention, a memory card which data can be written to and read from by a data processor is provided. The memory card includes a host interface that transmits and receives a command and data to and from the data processor, a nonvolatile memory that stores data, a controller that controls the operation of the memory card, and a storage section that stores specified management information. The management information includes retry setting information which specifies whether a retry function is executed or not when an error occurs during an operation of writing data to the nonvolatile memory.

The controller refers to the retry setting information in the data writing operation, and controls the data writing operation so as to disable the retry function in the event of an error in the data writing operation, when the retry setting information indicates disabling of the retry function or to enable the retry function in the event of an error in the data writing operation, when the retry setting information indicates enabling of the retry function.

In the memory card, the management information may include characteristic information specific to the memory card. In this case the controller may transmit the characteristic information to the data processor according to the request from the data processor.

The characteristic information may include information regarding maximum required time for data writing to the memory card, or information regarding a frequency of the retry process occurring in the memory card.

(2) In a second aspect of the invention, a data processor accessing a memory card which data can be written to and read from is provided. The memory card stores management information including retry setting information and characteristic information specific to the memory card. The retry setting information specifies whether a retry function is to be executed or not when an error occurs during a data writing operation.

The data processor includes a card interface that transmits and receives a command and data to and from the memory card, and a controller that controls the operation of the data processor. The controller reads the characteristic information from the memory card when the memory card is inserted in the data processor or when the data processor is turned on. It judges whether a retry function in the memory card is to be executed or not based on the read characteristic information, and transmits a command for setting the retry setting information to the memory card through the card interface according to the judging result.

(3) In a third aspect of the invention, a control method of a memory card which data can be written to and read from is provided. The memory card stores management information including retry setting information and characteristic information specific to the memory card. The retry setting information specifies whether a retry function is to be executed or not when an error occurs during a data writing operation. The control method includes referring to the retry setting information in the data writing operation, and disabling the retry function not to operate in the event of an error in the data writing operation, when the retry setting information indicates disabling of the retry function, or enabling the retry function in the event of an error in the data writing operation, when the retry setting information indicates enabling of the retry function.

(4) In a fourth aspect of the invention, a setting method of a memory card which data can be written to and read from is provided. The memory card stores management information including retry setting information and characteristic information specific to the memory card. The retry setting information specifies whether a retry function is to be executed or not when an error occurs during a data writing operation. The setting method includes reading the characteristic information from the memory card, judging whether a retry process in the memory card is to be executed or not based on the read characteristic information, and transmitting a command for setting the retry setting information to the memory card through the card interface according to the judging result.

(5) In a fifth aspect of the invention, a memory card which data can be written to and read from by a data processor is provided. The memory card includes a host interface that transmits and receives a command and data to and from the data processor, a nonvolatile memory that stores data, a controller that controls the operation of the memory card, and a storage section that stores specified management information.

The management information includes error correction setting information which specifies whether an error correction function is executed or not during an operation of reading data from the nonvolatile memory.

The controller refers to the error correction setting information during the data reading operations and controls the data reading operation so as not to apply the error correction function to data which is read when the error correction setting information indicates disabling of the error correction function or to apply the error correction function to data which is read when the error correction setting information indicates enabling of the error correction function.

The management information may include characteristic information specific to the memory card. In this case the controller may transmit the characteristic information to the data processor according to the request from the data processor.

(6) In a sixth aspect of the invention, a data processor accessing a memory card which data can be written to and read from is provided. The memory card is capable of applying an error correction to data which is read, stores management information including error correction setting information and characteristic information specific to the memory card. The error correction setting information specifies whether an error correction function is to be executed or not during a data reading operation. The data processor includes a card interface that transmits and receives a command and data to and from the memory card, and a controller that controls the operation of the data processor.

The controller reads the characteristic information from the memory card when the memory card is inserted in the data processor or when the data processor is turned on. It judges whether an error correction function in the memory card is to be executed or not based on the read characteristic information, and transmits a command for setting the error correction setting information to the memory card through the card interface according to the judging result.

(7) In a seventh aspect of the invention, a control method of a memory card which data can be written to and read from is provided. The memory card is capable of applying an error correction to data which is read, stores management information including error correction setting information which specifies whether an error correction function is to be executed or not during a data reading operation.

The control method includes referring to the error correction setting information during the data reading operation, and applying no error correction function to data which is read when the error correction setting information indicates disabling of the error correction function, or applying the error correction function to data which is read when the error correction setting information indicates enabling of the error correction function.

(8) In a eighth aspect of the invention, a setting method of a memory card which data can be written to and read from is provided. The memory card is capable of applying an error correction to data which is read, stores management information including error correction setting information and characteristic information specific to the memory card. The error correction setting information specifies whether an error correction function is to be executed or not during a data reading operation.

The setting method includes reading the characteristic information from the memory card, judging whether the error correction function is to be applied or not based on the read characteristic information, and transmitting a command for setting the error correction setting information to the memory card through the card interface, according to the judging result.

(Effects of the Invention)

Thus, according to the invention, operation or stop of a retry function or error correction function of a memory card can be set from the host. Hence, it becomes easy to cancel the retry function of the memory card as required and estimate the required writing time easily on the host side. That is, in an application demanding the real-time process, when write error occurs, the retry process is not executed and the write error is immediately notified to the host. Thus the host can easily handle the error so as to assure the real-time operation. Further when the host demands high data reliability but the memory card does not satisfy it, error correction function of the memory card is cancelled from the host side, and the high error correction function of the host is used. Hence the data write error can be corrected so that a specific data reliability can be assured.

BRIEF DESCRIPTION OF DRAWINGS

FIG. 2 is a diagram showing an example of management information stored in a register of the memory card.

FIG. 3 is a diagram showing an example of a block management table and data stored in the memory card.

| | Reference Signs |
|---|---|
| 1 | Memory card |
| 2 | Host interface |
| 3 | Controller |
| 4 | RAM |
| 5 | Instruction ROM |
| 6 | Buffer memory |
| 7 | Flash memory |
| 31 | Microprocessor (MPU) |
| 32 | Register |
| 33 | Error correcting section |
| 41 | Work RAM |
| 42 | Block management table |
| 50 | Host (data processor) |
| 51 | Controller |
| 53 | Data storage unit |
| 55 | Card interface |
| 57 | Input and output processor |
| 59 | Buffer memory |

BEST MODE FOR CARRYING OUT THE INVENTION

Referring now to the accompanying drawings, an embodiment of the invention is described below.

Figure 1:
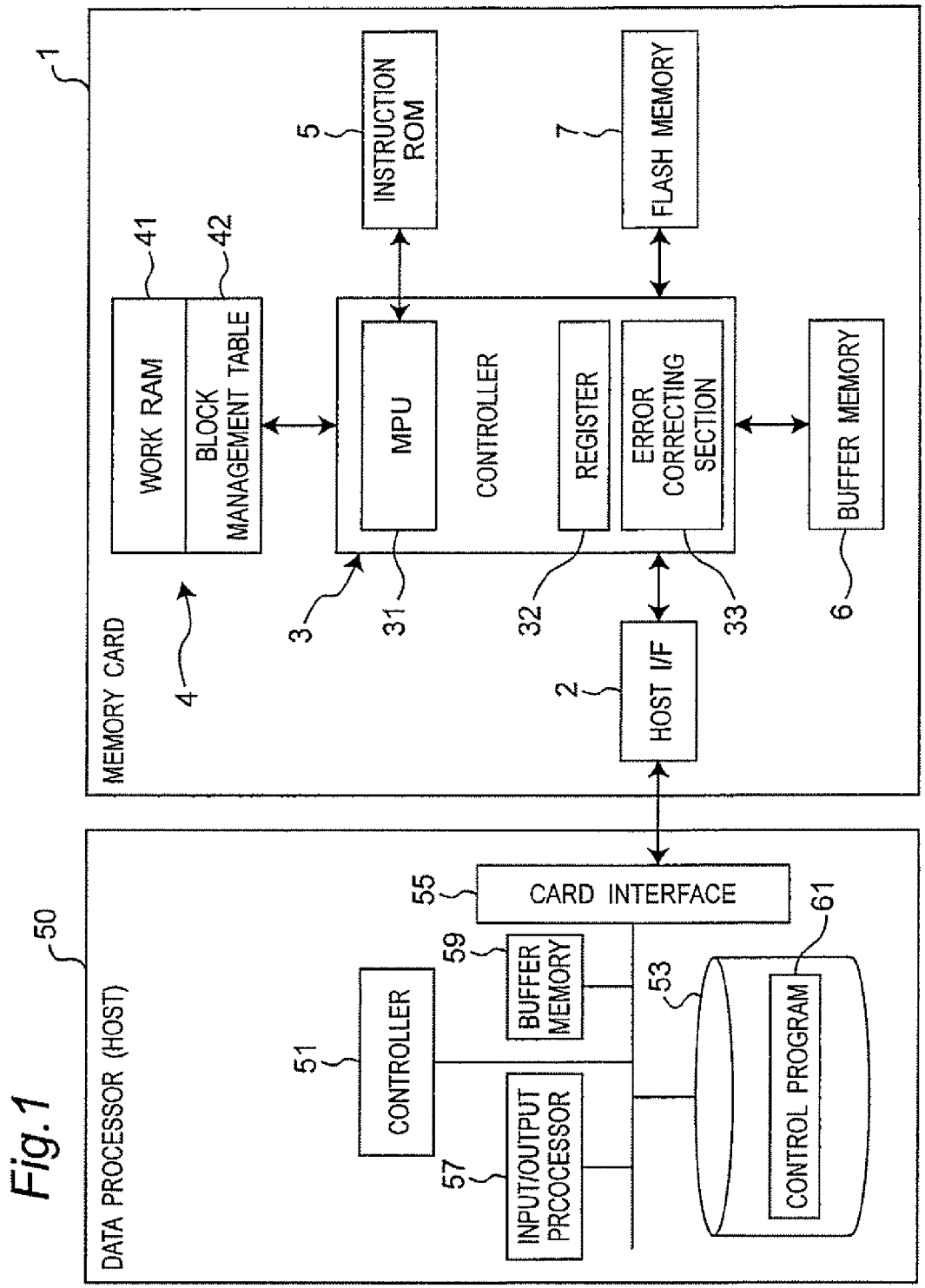
FIG. 1 is a block diagram of a configuration of a memory card and host (data processor) in an embodiment of the invention.

FIG. 1 is a block diagram showing a configuration of a memory card and a data processor (hereinafter called "host") in an embodiment of the invention.

(Host Configuration)

A host (data processor) 50 is, for example, a digital still camera, a digital video camera, a personal data assistant, a personal computer, and other electronic appliances.

The host 50 has a controller 51, a data storage unit 53, a card interface 55, an input and output processor 57, and a buffer memory 59. The data storage unit 53 stores a control program 61.

The card interface 55 exchanges data with the host interface 2 of the memory card 1. That is, the card interface 55 transmits and receives data to be read from and written to the memory card 1 and commands for various controls with the host interface 2.

The controller 51 controls the entire operation of the host 50, and cooperates with the control program 61 stored in the data storage unit 53 to realize specified functions as described below.

The input and output processor 57 includes input means used by the user for entering information and data about setting and operation in the host 50, and output means for delivering video and audio.

The buffer memory 59 is a memory for storing temporarily data to be written in the memory card 1, and has a sufficient capacity so as to absorb an error if a write error occurs in the memory card 1.

(Memory Card Configuration)

The memory card 1 is loaded in the host 50 to be used, and is a recording medium capable of writing and reading data to/from the host 50. The memory card 1 has a retry function for trying again when an error occurs in writing, and an error correction function for correcting data error.

The memory card 1 includes a host interface 2, a controller 3, RAM 4, an instruction ROM 5, a buffer memory 6, and a flash memory 7 which is a programmable nonvolatile memory.

The host interface 2 is a block for interface with the host 50 in which the memory card 1 is loaded, and transmits and receives data to be read from and written to the flash memory 7, commands for various controls, and a clock signal.

The controller 3 is a block for controlling the entire memory card 1, and has a microprocessor (hereinafter called "MPU") 31, a register 32, and an error correcting section 33.

The MPU 31 executes a control program stored in the instruction ROM 5 to control the RAM 4, flash memory 7, and buffer memory 6.

The register 32 is storage means for holding management information for the memory card 1. The management information includes setting values which are transferred from the host 50 through the host interface 2, and characteristic values specific to the memory card 1. FIG. 2 shows an example of management information stored in the register 32.

In FIG. 2, the management information includes "retry enable bit" and "error correction enable bit", as setting values transferred from the host 50. The retry enable bit is "retry setting information" for specifying whether the retry process is to be executed or not in data writing to the memory card 1. The correction enable bit is "error correction setting information" for specifying whether or not to the error correction process is executed in data reading from the memory card 1.

Further, as characteristic values specific to the memory card 1, the management information also holds "maximum required time of data writing", "retry occurrence frequency", "error occurrence frequency", and "error rate". The maximum required time of data writing includes the respective values for both cases where the retry process is done and where not done. The retry occurrence frequency is frequency or probability of occurrence of the retry processes. The error occurrence frequency is frequency or probability of occurrence of errors in data writing with the retry process not executed. The error rate includes the respective values in both cases where error correction process is done and where not done. Any information can be read from the host 50 by way of the host interface 2. Information stored in the management information as characteristic values specific to the memory card may also contain memory type, erase block size, management block side, operating temperature condition, power consumption, and so on.

Returning to FIG. 1, the error correcting section 33 generates and adds an error correction code to the data transferred from the host 50 when writing data, detects if there is any error in the data read from the flash memory 7 when reading data, and corrects the error if error is found.

The instruction ROM 5 is a read-only nonvolatile memory, and stores the control program for MPU 31. The buffer memory 6 temporarily stores the data transferred from the host. The flash memory 7 stores the data transferred from the host.

The RAM 4 is a volatile memory, and includes a work RAM 41 as working area of the controller 3, and a block management table 42. The block management table 42 is a table for managing usage state of the flash memory 7. FIG. 3 shows an example of the block management table 42.

Generally, reading form or writing to a physical block in the flash memory 7 is conducted with the specified address of logical block provided from the host 50. One of the roles of the block management table 42 is to convert (or assign) an address of a logical block (logical address) into an address of a physical block (physical address).

The block management table 42 in FIG. 3 manages correspondence of physical address and logical address which are block addresses, and usage state of physical address (that is, block specified by the physical address).

For example, as shown in FIG. 3, usage state of physical block, and number of logical address assigned to each physical block are written. Irrespective of being already used (the value is "0" in the usage state column), the physical block which is specified by the physical address having no corresponding logical address (physical address "6" in the example in FIG. 3) means that this physical block is a bad block. Such a physical block is hence not selected as a write address.

(Process by Host)

Figure 4:
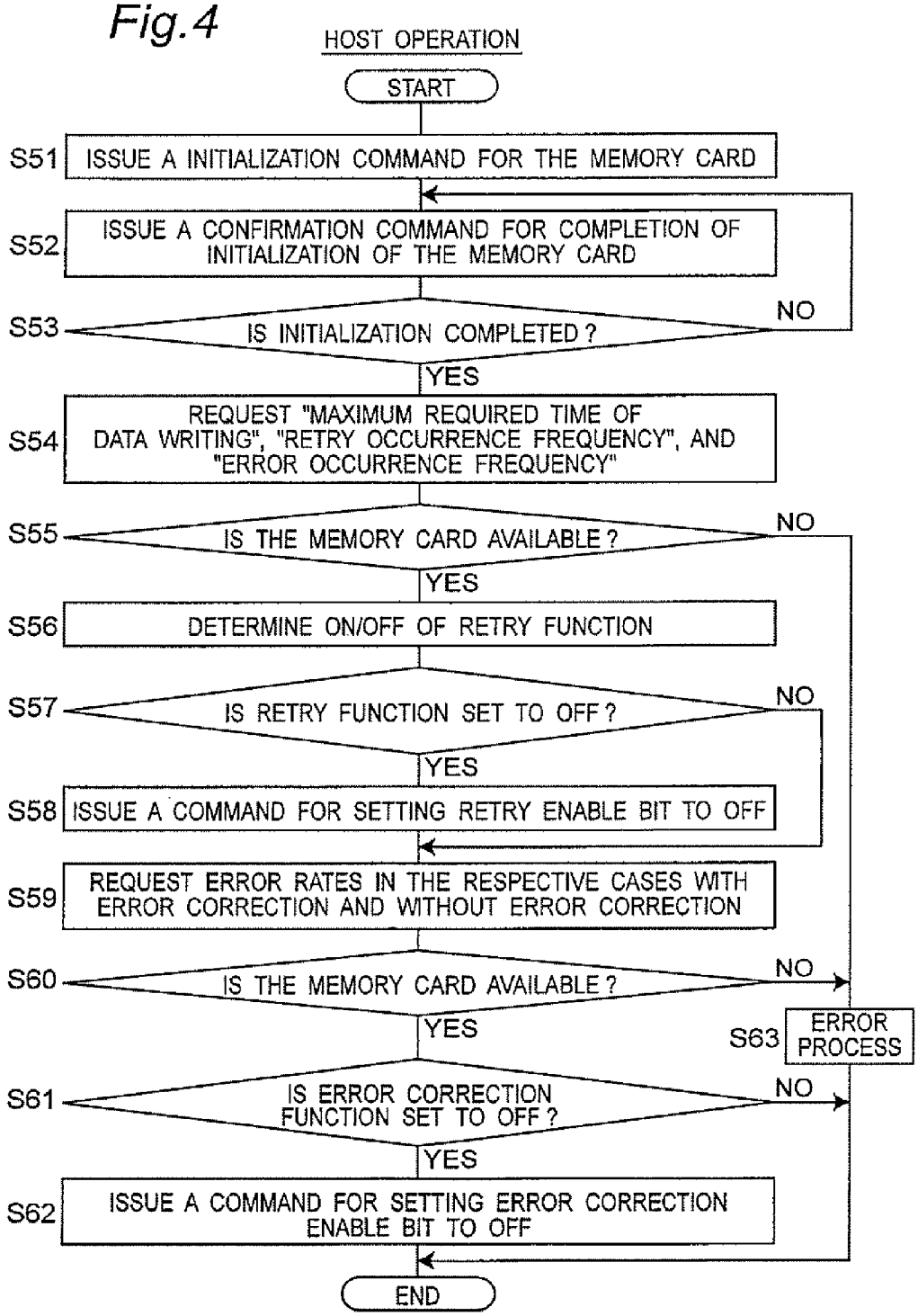
FIG. 4 is a flowchart of a process in the host executed on initialization of the memory card.

Referring to the flowchart in FIG. 4, an initialization process of the memory card 1 by the host 50 is explained. The process shown in FIG. 4 is executed by the controller 51 of the host 50, when the memory card 1 is newly loaded into the host 50, or when the host 50 with the memory card 1 loaded is turned on.

First, the controller 51 issues an initialization command for initializing the memory card 1, to the memory card 1 (S51). Receiving this command, the memory card 1 executes a specified initialization process. Next, the controller 51 sends a command for confirming completion of the initialization process in the memory card 1, to the memory card 1 (S52). Receiving this command, the memory card 1 sends back a response indicating whether the initialization process is complete or not, to the host 50. Receiving the response from the memory card 1, the controller 51 judges completion of the initialization process (S53).

If the initialization process is complete (Yes at step S53), the controller 51 requests the memory card to transmit "retry occurrence frequency", "error occurrence frequency", and "maximum required time of reading" for both cases where the retry process is done and not done (S54). According to this request, the memory card 1 transmits the corresponding information stored in the register 32 to the host 50. According to the information received from the memory card 1, the controller 51 judges whether the memory card 1 is available or not (S55). The judgment is done as follows, for example.

The data processor 50 has a buffer memory 59 having enough allowable capacity for absorbing write errors occurring in the memory card 1. The controller 51 judges whether the memory card 1 is available or not, depending on the fact whether judgment conditions determined based on the information received from the memory card 1 are beyond the allowable capacity of the buffer memory 59 or not. The following two points are considered as judgment condition.

Judgment Condition 1:

Retry occurrence frequency×Maximum required time of writing with retry process conducted.

Judgment Condition 2:

Error occurrence frequency×Maximum required time of writing with retry process not conducted.

When both judgment conditions 1 and 2 are beyond reference values, the controller 51 judges that judgment conditions are beyond the allowable capacity of the buffer memory 59, that the system would be broken down, and that the memory card 1 is unavailable. If either one of the judgment conditions 1 and 2 is within the reference value, it is judged that the memory card 1 is available. When it is judged that the memory card 1 is unavailable (No at step S55), error process is done (S63), and the initialization process is terminated.

On the other hand, when it is judged that the memory card 1 is available (Yes at step S55), the controller 1 judges whether the retry function of the memory card 1 is enabled or disabled on the basis of the judgment condition 1 (S56). That is, the judgment condition 1 is compared with a reference value for judging whether the retry function is to be enabled or disabled. When the judgment condition 1 is larger than the reference value, the retry function of the memory card 1 is to be disabled. This is because, if the maximum required time of writing is too long, it takes much time to record data due to execution of the retry process when the host 50 demands the real-time process such as a process for recording moving pictures or the like, and the real-time process may not be realized.

Thus, the host 50 can set ON/OFF of the retry function of the memory card 1. By setting the retry function to OFF if it is not needed, the writing time can be estimated easily. That is, in the event of write error, the write error is immediately notified to the host 50 without executing the retry process, so that the host 50 can handle an error process more easily.

When it is judged that the retry function is to be disabled (Yes at step S57), the controller 51 issues a command for setting the retry enable bit in the register 32 to OFF, to the memory card 1 (S58). Receiving this command, the memory card 1 sets the retry enable bit in the register 32 to OFF.

Consequently, the controller 51 requests the memory card 1 to send the error rates in the respective cases where error correction is processed and where not processed (S59).

On the basis of the received error rate in the case where the error correction is not processed, it is judged whether the memory card 1 is available or not (S60). For example, if the error rate with the error correction of the memory card 1 not conducted is very high, when it is judged that error could not be corrected even if the host side error correction function is used and that reliable data quality can not be obtained, the memory card 1 is judged to be unavailable. More specifically, as a result of comparing the error rate without the error correction of the memory card 1 with a specified reference value ("first reference values"), when the error rate of the memory card 1 is larger than the first reference value, it is judged that this memory card 1 is unavailable. The first reference value is set to be higher than the error rate which is correctable by the host 50.

When it is judged that the memory card 1 is unavailable (No at step S60), the error process is done (S63), and the initialization process is terminated.

When it is judged that the memory card 1 is available (Yes at step S60), the controller 1 judges whether the error correction function of the memory card 1 is to be enabled or disabled on the basis of the error rate when the error correction of the memory card 1 is processed (S61). When it is judged that the memory card 1 is to be enabled but enough data quality could not be obtained with the error correction function of the memory card 1, the error correction is executed on the host 50 side. To do so, the error correction function of the memory card 1 is disabled. More specifically, when the error rate of the memory card 1 with the error correction conducted is larger than a reference value ("second reference value", second reference value<first reference value) for judging enabling/disabling the error correction function, the error correction function in the memory card 1 is to be disabled.

When it is judged that the error correction function of the memory card 1 is disabled (Yes at step S61), the controller 51 issues a command for setting the error correction enable bit in the register 32 to OFF, to the memory card 1 (S62). Receiving this command, the memory card 1 set the error correction enable bit in the register 32 to OFF.

Thus, it is possible to set ON/OFF of the error correction function of the memory card 1, on the host side. Hence, the host 50 having high error correction performance can disable the error correction function of the memory card 1 when judging that the error correction performance of the memory card 1 is lower than the demanded performance, thus allowing the error correction to be conducted on the host side and data reliability to be enhanced.

In this manner, the host 50 reads out characteristic values specific to the memory card from the memory card 1 when initializing the memory card 1, and sets ON/OFF of the retry function and the error correction function of the memory card 1, as required, on the basis of the characteristic values.

(Data Write Process)

Figure 5:
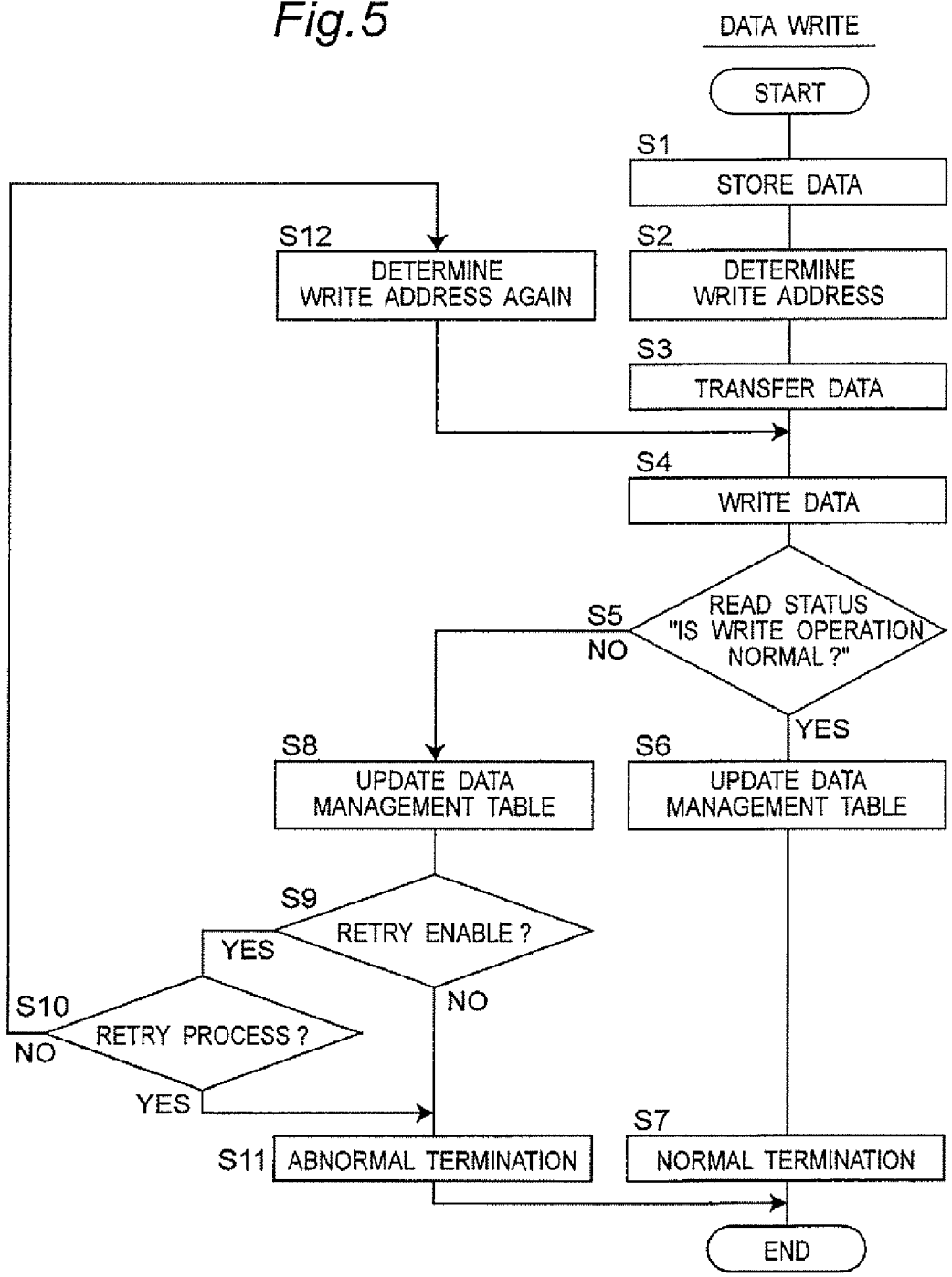
FIG. 5 is a flowchart of a write process in the memory card.

Data write process of the memory card 1 is explained by referring to the flowchart in FIG. 5. The flowchart in FIG. 5 is executed by the controller 3 of the memory card 1. This process is started when the memory card 1 receives a write command from the host 50. For the sake of simple explanation, a page which is data writing unit in the flash memory 7 and a block which is data erasing unit are set in the same size. Hence, data is written in block unit.

First, the MPU 31 receives a write command from the host 50 by way of the host interface 2, and stores write data sent from the host 50 temporarily in the buffer memory 6 (S1).

Next, the MPU 31 refers to information stored in the block management table 42 shown in FIG. 3 to search for a physical address at which data can be recorded, that is, unused "1" physical address (S2).

Data is read from the buffer memory 6 in block unit, is added an error correction code by error correcting section 33, and then is transferred to the register in the flash memory 7 (S3).

A write command is issued to the flash memory 7. Data is written into the searched physical address (S4). After writing operation, it is judged if processing status of data writing is normal in the flash memory 7 (S5). For this purpose, a status read command is issued to the flash memory 7, and the state indicating whether the data writing is terminated normally or abnormally in the flash memory 7 is acquired from the flash memory 7. An error may be replied in the status read when abnormal end occurs caused by erase process specific to the flash memory, aside from a write error.

When judging that data is written normally according to the response to the status read command from the flash memory 7 (Yes at step S5), the MPU 31 changes information about usage state from unused "1" to used "0" for the corresponding address on the block management table 42. At the same time, the MPU 31 write the logical address (logical block number) in the table 42 (S6), and terminates the write process normally (S7). When the write process is terminated normally, it is notified to the host 50.

On the other hand, at step S5, if it is judged that data is not written normally (No at step S5), in the address of data writing, management information about usage state on the block management table 42 is changed from unused "1" to used "0" (S8).

Referring next to the retry enable bit stored in the register 32, it is judged whether the value indicates ON (enable) or OFF (disable) (S9).

When the retry enable bit is OFF (No at step S9), it means disabling of the retry function. The retry process is controlled not to operate, and a specified error process is executed (S11). Then the write process is terminated. The specified error process is, for example, to notify occurrence of error to the host 50. In this case, a logical address is not written into the block management table 42. That is, the physical address becomes a bad block.

On the other hand, when the retry enable bit is ON (enable) (Yes at step S9), it is judged if the write process is a retry process (second process) or not (S10). When it is judged to be a retry process, the specified error process is executed (S11), and then the write process is terminated. In this case, a logical address is not written into the block management table 42. That is, the physical address becomes a bad block.

At step S10, when not a retry process, the process goes to step S12 for controlling the retry process to operate. At step S12, similar to step S2, referring to the block management table 42, a physical address at which data can be written, that is, unused "1" physical address is determined, and the process goes to step S4. The subsequent process is same as that mentioned above.

According to such procedure, data stored in the buffer memory 6 is written (transferred) repeatedly into the flash memory 7 in block unit. When all data is written normally, completion of writing is notified to the host 50. In the event of abnormality occurring in data writing, if the retry function is OFF, subsequent data is not written, and it is notified to the host 50 on the moment of occurrence of abnormality.

Thus, in the embodiment, only when the retry enable bit is enable (Yes at step S9), the retry process is executed. Hence, by setting in advance the retry enable bit (disable) to OFF by the host 50, in the event of write abnormality, the abnormality is immediately notified to the host 50 with out waiting time for the retry process. Further, by referring to the maximum required time of writing and retry occurrence frequency which are read in advance from the register 32, error processing corresponding to these values can be executed at the host 50 side.

The above embodiment describes the case when write data is not transferred again from the host 50 during the retry process. However, write data may be transferred again.

(Data Read Process)

Figure 6:
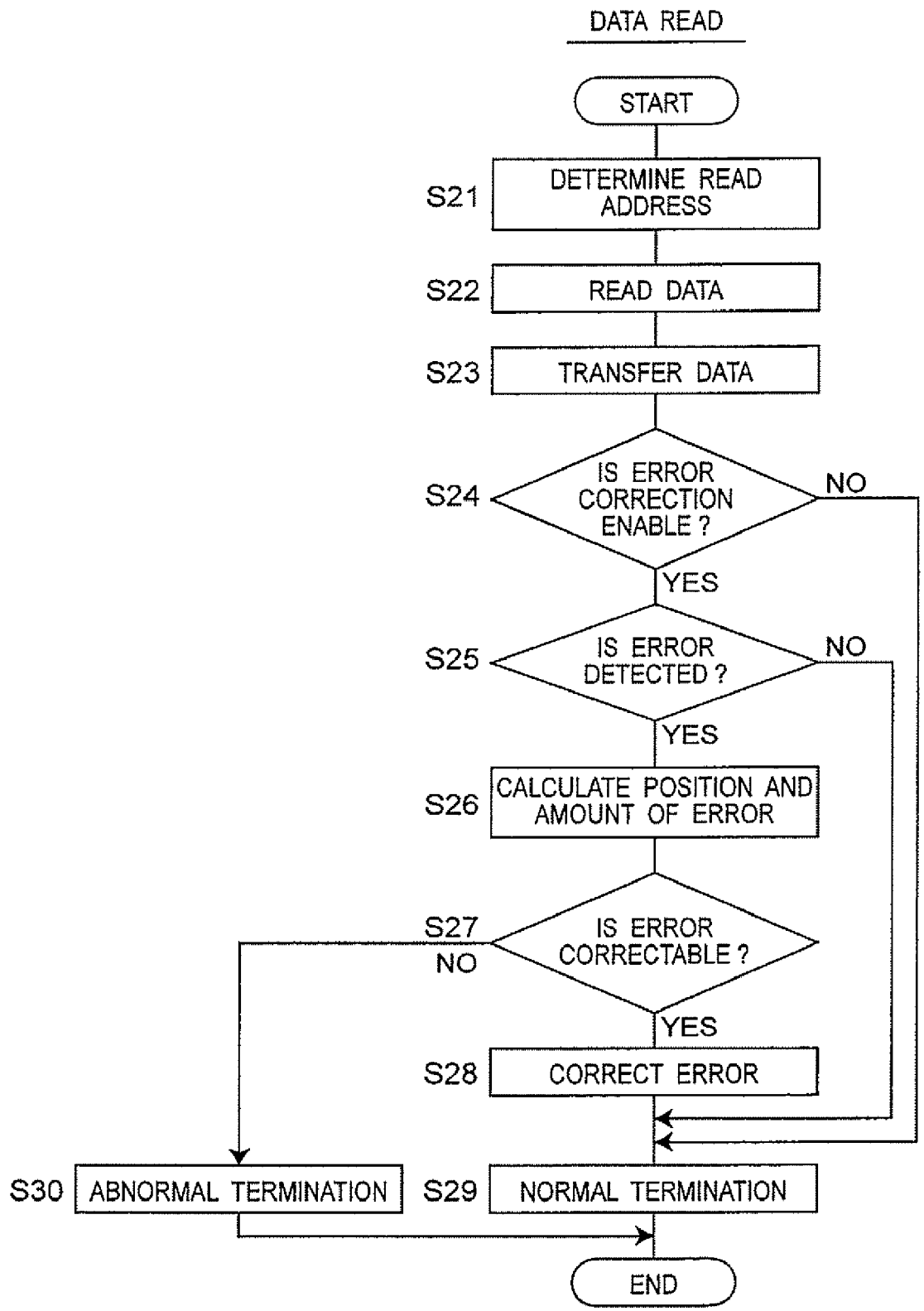
FIG. 6 is a flowchart of a read process in the memory card.

Data read process of the memory card 1 is explained by referring to the flowchart in FIG. 6. The process shown in FIG. 6 is executed by the controller 3. This process is started when the memory card 1 receives a read command from the host 50.

When the controller 3 receives a read command from the host 50 by way of the host interface 2, the MPU 31 refers to information written in the block management table 42, and searches for a physical address corresponding to the logical address specified as a read address by the host 50.

Data is read from the block specified by the searched physical address (S22). For this purpose, the MPU 31 issues a read command to the flash memory 7, and the data read is stored to the register in the flash memory 7.

The data is read from the register in the flash memory 7. After detection of error through the error correcting section 33, the data is transferred to the buffer memory 6, and is stored temporarily (S23).

It is judged if the error correction enable bit stored in the register 32 is ON (enable) or not (S24). When the error correction enable bit is ON (enable), that is when the error correction is conducted (Yes at step S24), it is judged if error is detected or not (S25). If no error is detected (No at step S25), the process is terminated normally. If error is detected (Yes at step S25), a position and amount of error are calculated (S26), and it is judged if the error can be corrected or not based on the calculated information (S27).

At step S27, when the detected error is within error correction ability of the memory card 1, the data stored in the buffer memory 6 is corrected (S28), and the process is normally terminated (S29). If the detected error is beyond the error correction ability of the memory card 1, judging that the error correction is disabled (No at step S27), the process is terminated abnormally (S30).

If the error correction enable bit is OFF (disable) (No at step S24), the process is terminated normally without error correction (S29).

In the case of normal termination (S29), reading data in block unit from the flash memory 7 to the buffer memory 6 is repeated, and the data on the buffer memory 6 is transferred to the host 50 through the host interface 2. In the event of abnormal termination (S30), the fact is notified to the host 50, and data reading from the flash memory 7 is stopped after the occurrence of abnormality.

Thus, according to the embodiment, since the error correction process is conducted only when the error correction enable bit is ON (enable) at step S24, by disabling the error correction enable bit, even if an error exceeding the correction ability occurs while reading data, all data in the flash memory 7 can be read out and outputted.

In other words, the host 50 preliminarily reads in advance from the register 32 the error rate in the case of error correction process, and determines setting of the error correction enable bit based on the read error rate. Thus, if the error correction function is not needed in the memory card 1, it is possible to disable the function. For example, when the host 50 has a stronger error correction function than the memory card 1 and requires a high data reliability, the error correction enable bit is set to disable (OFF) to make the error correction function disabled. Hence, in data writing, it is possible to add a powerful error correction code to write data on the host side, and then write the data, and in data reading, it is possible to correct error on the host side. Accordingly, the error rate in data access can be lowered.

The foregoing embodiment relates to the memory card mounting a nonvolatile memory, but the invention may be similarly applied to the nonvolatile memory incorporated in an electronic appliance, and the application of the concept of the invention is not limited to the memory card alone.

INDUSTRIAL APPLICABILITY

The invention can be applied in a memory card capable of executing a retry process or an error correction process, and a data processor accessing such memory card. In particular, for the memory card capable of executing the retry process or error correction process, the invention enables setting of enabling/disabling of the retry process or error correction process in the memory card, as required, from the host side, Thus the invention achieves a high processing ability, and hence it is very useful for a data processor (host) not depending on the ability of the memory card, and a memory card connected thereto.

Although the present invention has been described in connection with specified embodiments thereof, many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2004-026413, filed on Feb. 3, 2004, which is expressly incorporated herein by reference in its entirety.

The invention claimed is:

1. A memory card in which data can be written to and read from by a host data processor, comprising:
    a host interface that transmits and receives a command and data to and from the host data processor;
    a nonvolatile memory that stores data;
    a controller that controls an operation of the memory card; and
    a storage that stores specified management information,
    wherein the management information includes retry setting information transferred from the host data processor through the host interface and characteristic information specific to the memory card, the retry setting information specifies whether a retry function is executed or not when an error occurs during an operation of writing data to the nonvolatile memory, and
    the controller refers to the retry setting information in the data writing operation, and controls the data writing operation so as to disable the retry function in the event of an error in the data writing operation, when the retry setting information indicates disabling of the retry function and to enable the retry function in the event of an error in the data writing operation, when the retry setting information indicates enabling of the retry function.

2. The memory card according to claim 1, wherein the controller transmits the characteristic information to the host data processor according to the request from the host data processor.

3. The memory card according to claim 2, wherein the characteristic information includes information regarding a maximum required time for writing data to the memory card.

4. The memory card according to claim 2, wherein the characteristic information includes information regarding a frequency of the retry function occurring in the memory card.

5. A host data processor accessing a memory card in which data can be written to and read from, the memory card storing management information including retry setting information transferred from the host data processor and characteristic information specific to the memory card, the retry setting information specifying whether a retry function is to be executed or not when an error occurs during a data writing operation, the host data processor comprising:

a card interface that transmits and receives a command and data to and from the memory card; and a controller that controls the operation of the host data processor, wherein the controller reads the characteristic information from the memory card when the memory card is inserted in the host data processor or when the host data processor is turned on, judges whether a retry function in the memory card is to be executed or not based on the read characteristic information, and transmits a command for setting the retry setting information to the memory card through the card interface according to the judging result.

6. A control method of a memory card in which data can be written to and read from, the memory card storing management information including retry setting information transferred from a host data processor and characteristic information specific to the memory card, the retry setting information specifying whether a retry function is to be executed or not when an error occurs during a data writing operation, the control method comprising:

referring to the retry setting information in the data writing operation; and disabling the retry function not to operate in the event of an error in the data writing operation, when the retry setting information indicates disabling of the retry function, and enabling the retry function in the event of an error in the data writing operation, when the retry setting information indicates enabling of the retry function.

7. A setting method of a memory card in which data can be written to and read from, the memory card storing management information including retry setting information transferred from a host data processor and characteristic information specific to the memory card, the retry setting information specifying whether a retry function is to be executed or not when an error occurs during a data writing operation, the setting method comprising:

reading the characteristic information from the memory card;

judging whether a retry process in the memory card is to be executed or not based on the read characteristic information; and transmitting a command for setting the retry setting information to the memory card through the card interface according to the judging result.

* * * * *